US011206009B2

(12) United States Patent
Yantchev

(10) Patent No.: US 11,206,009 B2
(45) Date of Patent: Dec. 21, 2021

(54) TRANSVERSELY-EXCITED FILM BULK ACOUSTIC RESONATOR WITH INTERDIGITAL TRANSDUCER WITH VARIED MARK AND PITCH

(71) Applicant: Resonant Inc., Goleta, CA (US)

(72) Inventor: Ventsislav Yantchev, Sofia (BG)

(73) Assignee: Resonant Inc., Austin, TX (US)

( * ) Notice: Subject to any disclaimer, the term of this patent is extended or adjusted under 35 U.S.C. 154(b) by 14 days.

(21) Appl. No.: 16/805,471

(22) Filed: Feb. 28, 2020

(65) Prior Publication Data

US 2021/0067138 A1 Mar. 4, 2021

Related U.S. Application Data

(60) Provisional application No. 62/892,871, filed on Aug. 28, 2019.

(51) Int. Cl.

*H03H 9/25* (2006.01)
*H03H 9/64* (2006.01)
*H03H 9/02* (2006.01)
*H03H 9/56* (2006.01)
*H03H 9/145* (2006.01)

(52) U.S. Cl.

CPC .......... *H03H 9/25* (2013.01); *H03H 9/02228* (2013.01); *H03H 9/02559* (2013.01); *H03H 9/14582* (2013.01); *H03H 9/56* (2013.01); *H03H 9/6406* (2013.01)

(58) Field of Classification Search

CPC .. H03H 9/02; H03H 9/25; H03H 9/64; H03H 9/145

USPC .................................................. 333/193–196

See application file for complete search history.

(56) References Cited

U.S. PATENT DOCUMENTS 5,853,601 A 12/1998 Krishaswamy et al.
6,540,827 B1 4/2003 Levy et al.
6,707,229 B1 * 3/2004 Martin .............. H03H 9/14547 310/311
7,463,118 B2 12/2008 Jacobsen (Continued)

FOREIGN PATENT DOCUMENTS

WO 2016017104 2/2016
WO 2018003273 A1 1/2018

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Dean O Takaoka

(74) *Attorney, Agent, or Firm* — SoCal IP Law Group LLP; John E. Gunther; Steven C. Sereboff

(57) ABSTRACT

Acoustic resonator devices and filters are disclosed. An acoustic resonator includes a substrate having a surface and a single-crystal piezoelectric plate having parallel front and back surfaces, the back surface attached to the surface of the substrate. An interdigital transducer (IDT) is formed on the front surface of the single-crystal piezoelectric plate. The IDT is configured to excite a primary acoustic mode in the diaphragm in response to a radio frequency signal applied to the IDT. A pitch between adjacent fingers of the IDT is varied along one or both of an aperture of the IDT and a length of the IDT.

10 Claims, 12 Drawing Sheets

500

1st pitch/mark zone 530
2nd pitch/mark zone 540
P1 P2 P2 P1
510 512 514 516 520 522 524
M1 M2 M1+M2/2
M1/2 M1/2 M2/2 M2/2

Unit Cell
(substantially expanded horizontally)

(56) References Cited

U.S. PATENT DOCUMENTS

| | | | |
|---|---|---|---|
| 7,535,152 B2 | 5/2009 | Ogami et al. | |
| 7,684,109 B2 | 3/2010 | Godshalk et al. | |
| 7,868,519 B2 | 1/2011 | Umeda | |
| 8,278,802 B1 | 10/2012 | Lee et al. | |
| 8,344,815 B2 * | 1/2013 | Yamanaka | H03H 9/643 331/154 |
| 8,829,766 B2 | 9/2014 | Milyutin et al. | |
| 8,932,686 B2 | 1/2015 | Hayakawa et al. | |
| 9,130,145 B2 * | 9/2015 | Martin | H01L 41/047 |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 * | 8/2017 | Kando | H03H 9/25 |
| 9,780,759 B2 | 10/2017 | Kimura et al. | |
| 10,200,013 B2 | 2/2019 | Bower et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0261250 A1 | 12/2004 | Kadota et al. | |
| 2007/0194863 A1 | 8/2007 | Shibata et al. | |
| 2010/0064492 A1 | 3/2010 | Tanaka | |
| 2010/0123367 A1 | 5/2010 | Tai et al. | |
| 2011/0109196 A1 | 5/2011 | Goto | |
| 2011/0278993 A1 | 11/2011 | Iwamoto | |
| 2013/0234805 A1 | 9/2013 | Takahashi | |
| 2013/0321100 A1 * | 12/2013 | Wang | H01L 41/107 333/187 |
| 2014/0145556 A1 * | 5/2014 | Kadota | H03H 9/02992 310/313 A |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2017/0370791 A1 | 12/2017 | Nakamura et al. | |
| 2018/0123016 A1 | 5/2018 | Gong et al. | |
| 2018/0191322 A1 | 7/2018 | Chang et al. | |
| 2019/0068164 A1 | 2/2019 | Houlden et al. | |
| 2019/0131953 A1 | 5/2019 | Gong et al. | |
| 2019/0273480 A1 | 9/2019 | Lin | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators with High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Webster Dictionary Meaning of "diaphragm" Merriam Webster since 1828.

Safari et al. "Piezoelectric for Transducer Applications" published by Elsevier Science Ltd., pp. 4 (Year 2000).

Moussa et al. Review on Triggered Liposomal Drug Delivery with a Focus on Ultrasound 2015, Bentham Science Publishers, pp. 16 (Year 2005).

Acoustic Properties of Solids ONDA Corporation 592 Weddell Drive, Sunnyvale, CA 94089, Apr. 11, 2003, pp. 5 (Year 2003).

Bahreynl, B. Fabrication and Design of Resonant Microdevices Andrew William, Inc. 2018, NY (Year 2008).

Material Properties of Tibtech Innovations, © 2018 TIBTECH Innovations (Year 2018).

Naumenko et al., "Optimal orientations of Lithium Niobate for resonator SAW filters", 2003 IEEE Ultrasonics Symposium-pp. 2110-2113. (Year: 2003).

* cited by examiner

TRANSVERSELY-EXCITED FILM BULK ACOUSTIC RESONATOR WITH INTERDIGITAL TRANSDUCER WITH VARIED MARK AND PITCH

RELATED APPLICATION INFORMATION

This patent claims priority from provisional patent application 62/892,871, filed Aug. 28, 2019, entitled XBAR RESONATORS WITH REDUCED SPURIOUS MODES. This patent is related to application Ser. No. 16/230,443, filed Dec. 21, 2018, entitled TRANSVERSELY-EXCITED FILM BULK ACOUSTIC RESONATOR, now U.S. Pat. No. 10,491,192. This patent is related to application Ser. No. 16/438,141, filed Jun. 11, 2019, entitled SOLIDLY-MOUNTED TRANSVERSELY-EXCITED FILM BULK ACOUSTIC RESONATOR, now U.S. Pat. No. 10,601,392.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously described element having the same reference designator.

DETAILED DESCRIPTION

Description of Apparatus

Figure 1:
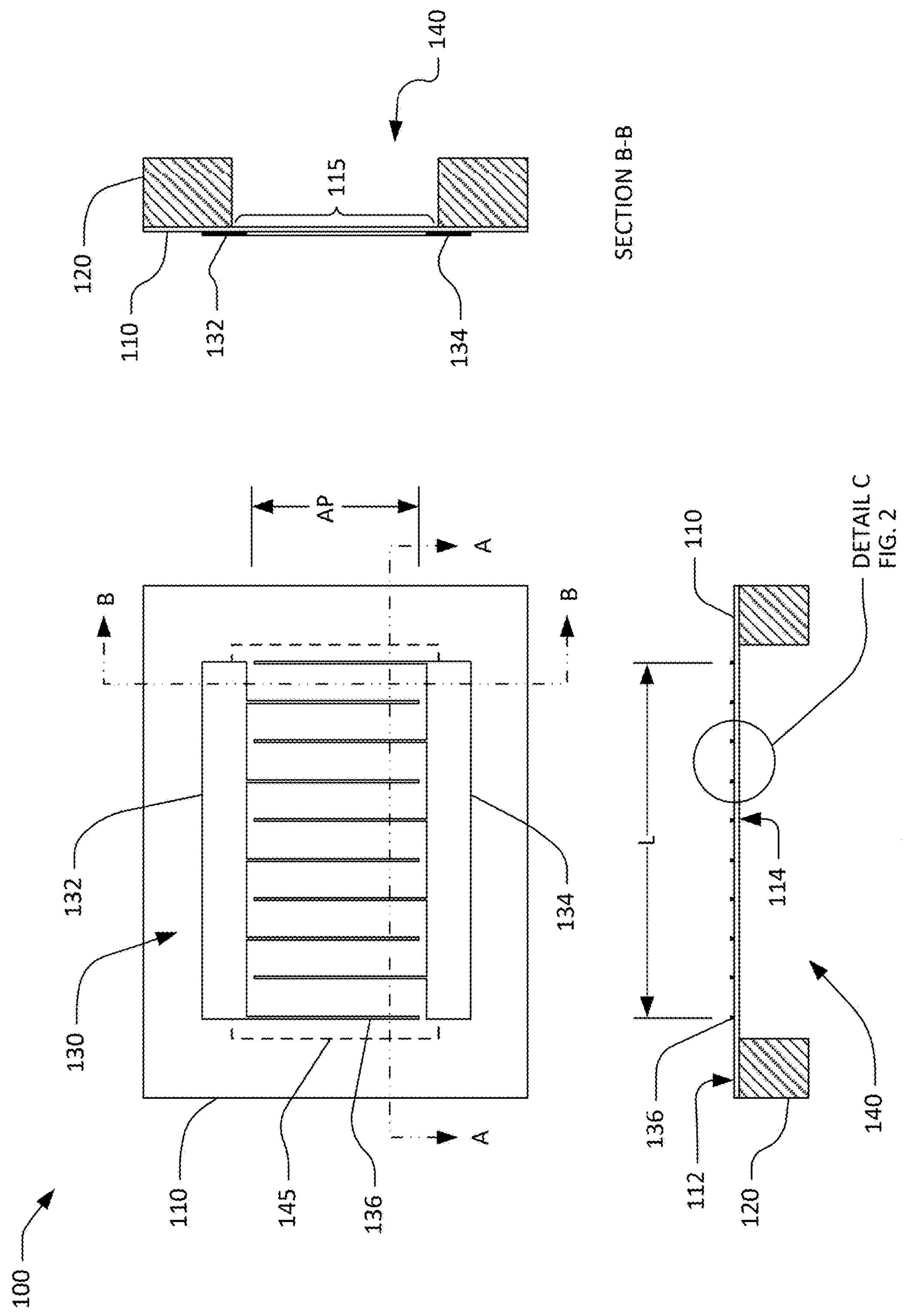
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in U.S. Pat. No. 10,491,192. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FIG. 3B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of fingers, such as finger 136, extending from a first busbar 132 and a second plurality of fingers extending from a second busbar 134. The first and second pluralities of fingers are interleaved. The interleaved fingers overlap for a distance AP, commonly referred to as the "aperture" of the IDT. The center-to-center distance L between the outermost fingers of the IDT 130 is the "length" of the IDT. The fingers are typically, but not necessarily, parallel to each other.

The first and second busbars 132, 134 serve as the terminals of the XBAR 100. The piezoelectric plate 110 and the IDT 130 are configured such that a radio frequency or microwave signal applied between the two busbars 132, 134 of the IDT 130 excites a primary acoustic mode within the piezoelectric plate 110. The primary acoustic mode is a bulk shear mode where the primary direction of atomic motion within the piezoelectric plate 110 is parallel to the surfaces of the plate and perpendicular to the fingers of the IDT 130. Acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
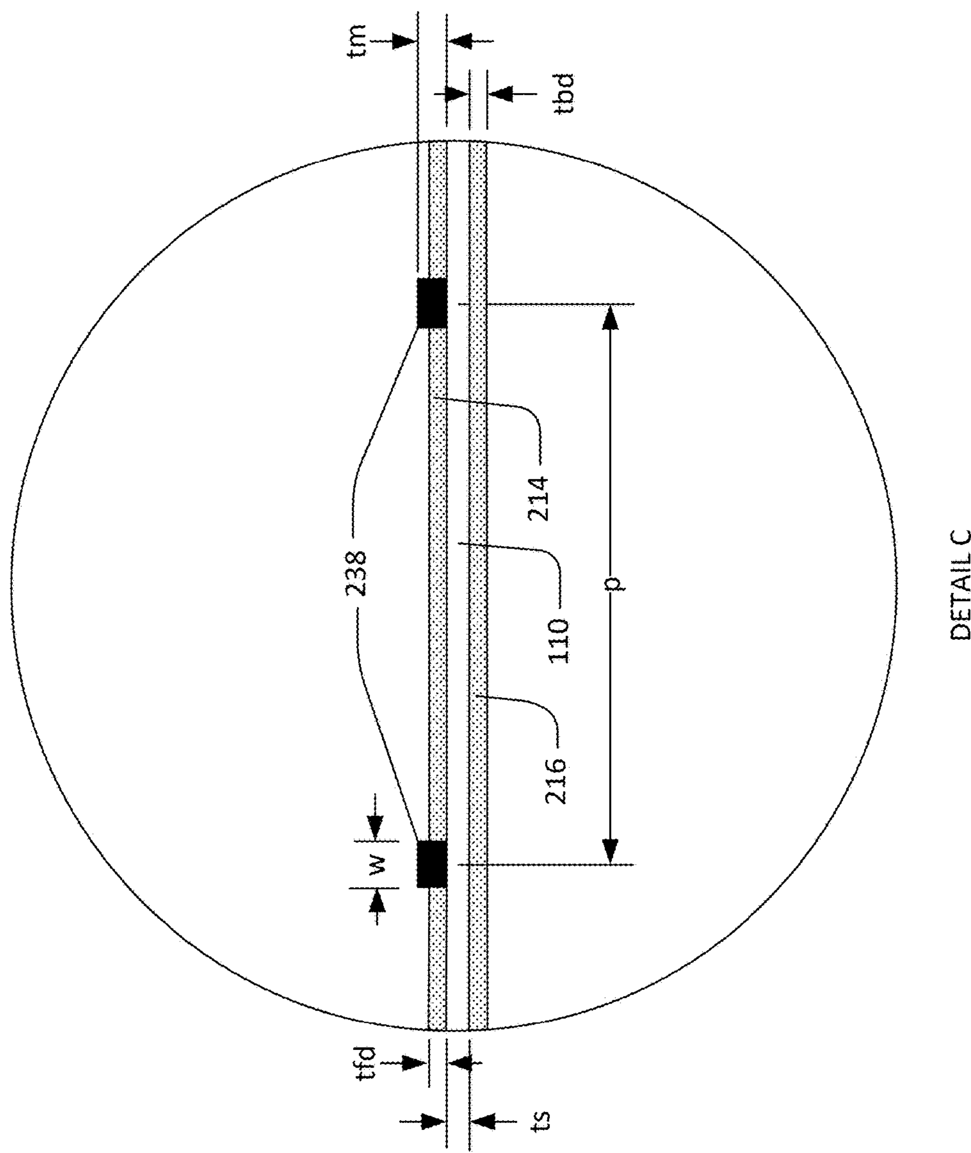
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum, a substantially aluminum alloys, copper, a substantially copper alloys, molybdenum, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the "pitch" of the IDT fingers, which may be referred to as the pitch of the IDT and/or the pitch of the XBAR. For an IDT with constant pitch, the pitch is equal to the center-to-center spacing of the fingers. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about 2.5 times the thickness ts of the piezoelectric slab 212. The thickness of the busbars (132, 134 in FIG. 1) of the IDT may be the same as, or greater than, the thickness tm of the IDT fingers.

Figure 3:
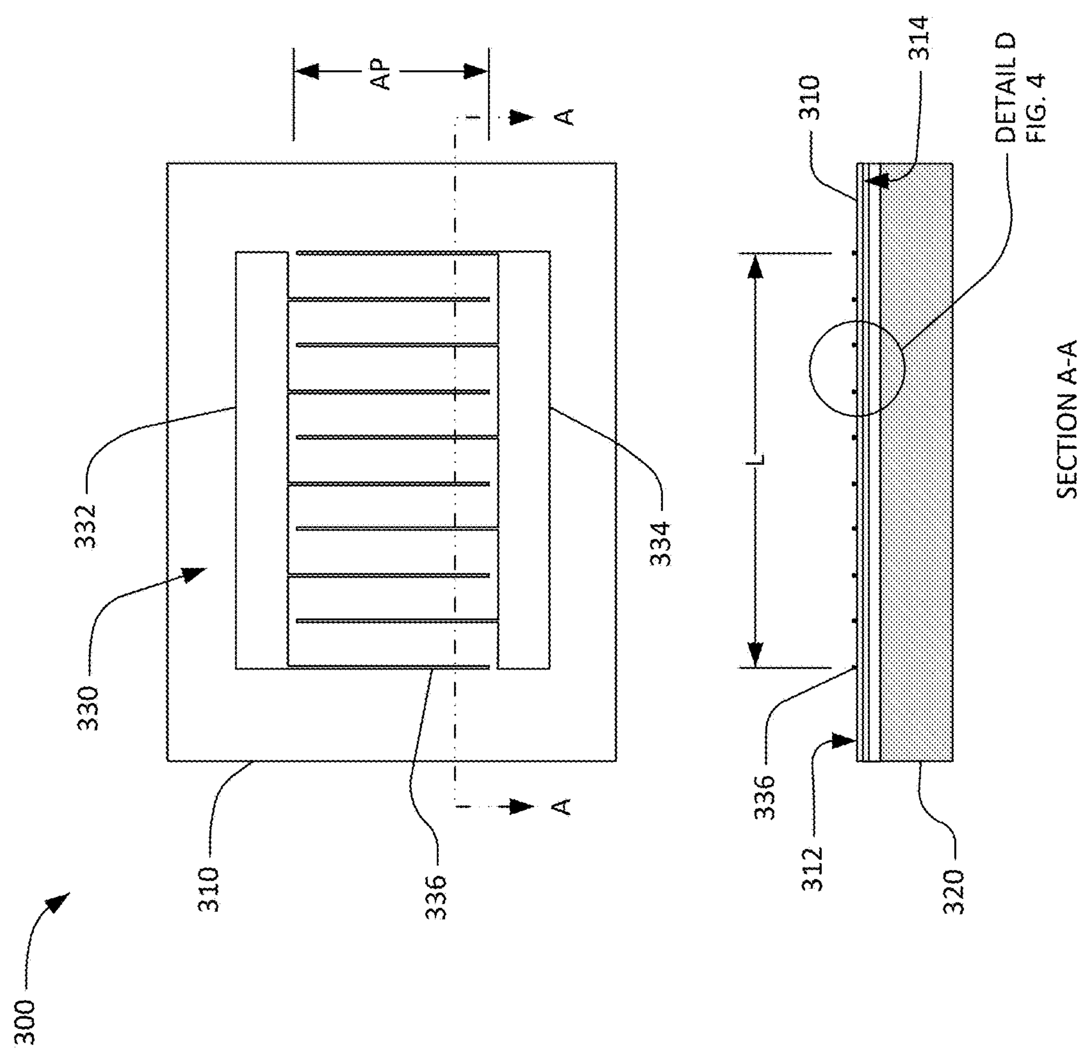
FIG. 3 includes a schematic plan view and a schematic cross-sectional view of a solidly-mounted transversely-excited film bulk acoustic resonator (SM XBAR).

FIG. 3 shows a simplified schematic top view and an orthogonal cross-sectional view of a solidly-mounted transversely-excited film bulk acoustic resonator (SM XBAR) 300 as described in patent application Ser. No. 16/438,141. SM XBAR resonators, such as the resonator 300, may be used in a variety of RF filters including band-reject filters, band-pass filters, duplexers, and multiplexers.

The SM XBAR 300 is made up of a thin film conductor pattern formed on a front surface 312 of a piezoelectric plate 310 having parallel front and back surfaces 312, 314, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces of the plate. However, SM XBARs may be fabricated on piezoelectric plates with other crystallographic orientations.

The back surface 314 of the piezoelectric plate 310 is attached to, and mechanically supported by, a substrate 320. The substrate 320 may be, for example, silicon, sapphire, quartz, or some other material. As will be described subsequently, the piezoelectric plate 310 may be attached to the substrate 320 via a plurality of intermediate material layers.

The conductor pattern of the SM XBAR 300 includes an IDT 330 similar to the IDT 130 previously described. The IDT 330 includes a first plurality of fingers, such as finger 336, extending from a first busbar 332 and a second plurality of fingers extending from a second busbar 334. The first and second pluralities of parallel fingers are interleaved. The interleaved fingers overlap for a distance AP, commonly referred to as the "aperture" of the IDT. The center-to-center distance L between the outermost fingers of the IDT 330 is the "length" of the IDT.

The first and second busbars 332, 334 serve as the terminals of the SM XBAR 300. A radio frequency or microwave signal applied between the two busbars 332, 334 of the IDT 330 excites a primary acoustic wave within the piezoelectric plate 310. The excited primary acoustic wave is a bulk shear wave that propagates in the direction normal to the surface of the piezoelectric plate 310.

For ease of presentation in FIG. 3, the geometric pitch and width of the IDT fingers are greatly exaggerated with respect to the length (dimension L) and aperture (dimension AP) of the SM XBAR. A typical SM XBAR has more than ten parallel fingers in the IDT 310. An SM XBAR may have hundreds, possibly thousands, of parallel fingers in the IDT 310. Similarly, the thickness of the fingers in the cross-sectional views is greatly exaggerated.

Figure 4:
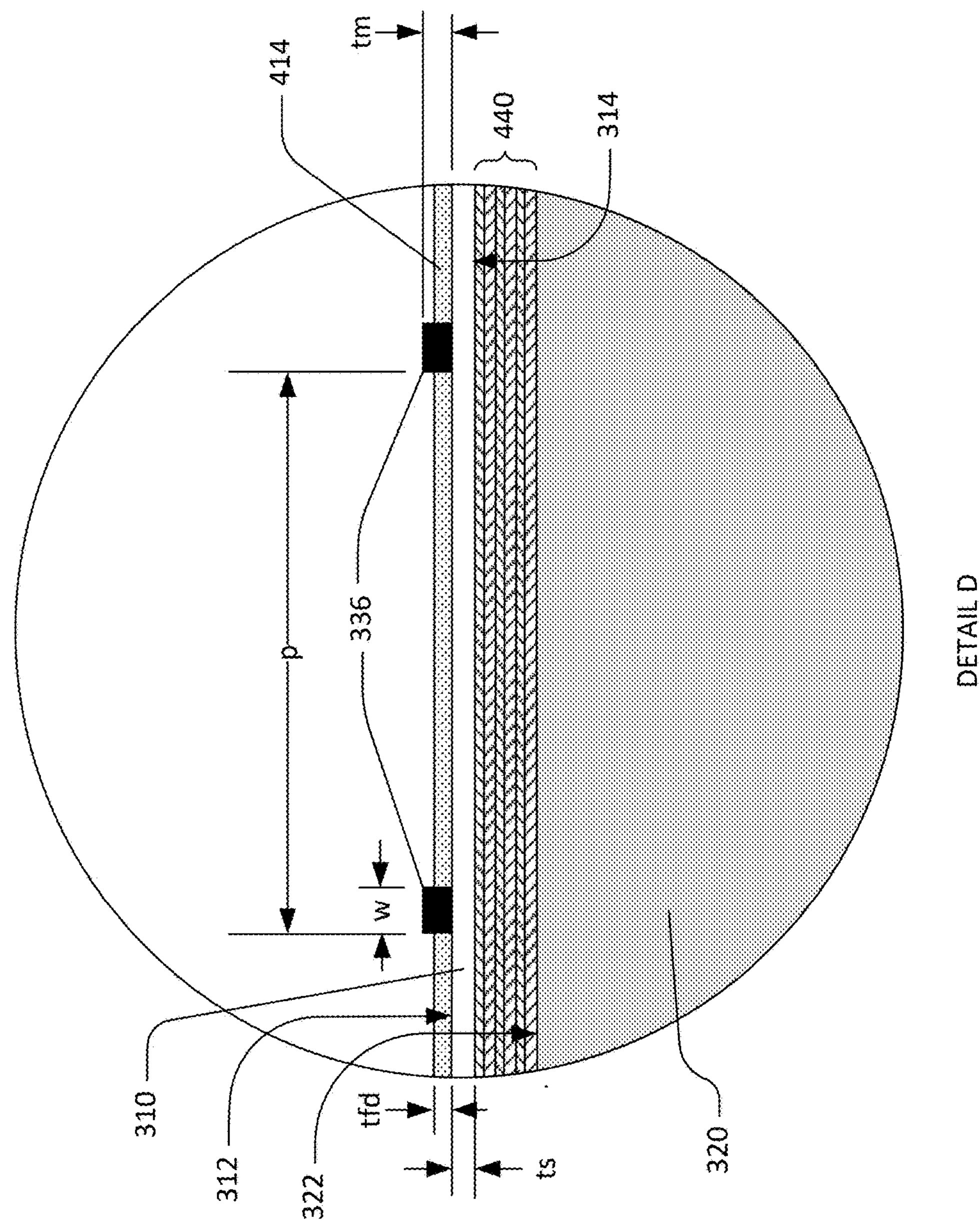
FIG. 4 is an expanded schematic cross-sectional view of a portion of the SM XBAR of FIG. 3.

FIG. 4 shows a detailed schematic cross-sectional view of detail D of the SM XBAR 300 of FIG. 3. The piezoelectric plate 310 is a single-crystal layer of piezoelectric material having a thickness ts. ts may be, for example, 100 nm to 1500 nm. The IDT fingers 336 may be one or more layers of conductive materials as previously described. Dimension p is the center-to-center spacing or "pitch" of the IDT fingers. Dimension w is the width or "mark" of the IDT fingers.

A front-side dielectric layer 414 may optionally be formed on the front surface 312 of the piezoelectric plate 310. The front-side dielectric layer 414 has a thickness tfd. The front-side dielectric layer 414 may be formed between the IDT fingers 336. Although not shown in FIG. 4, the front side dielectric layer 414 may also be deposited over the IDT fingers 336. The front-side dielectric layer 414 may be a non-piezoelectric dielectric material, such as silicon dioxide or silicon nitride. tfd may be, for example, 0 to 500 nm.

An acoustic Bragg reflector 440 is sandwiched between a surface 322 of the substrate 320 and the back surface 314 of the piezoelectric plate 310. The term "sandwiched" means the acoustic Bragg reflector 440 is both disposed between and physically connected to a surface 322 of the substrate 320 and the back surface 314 of the piezoelectric plate 310. In some circumstances, thin layers of additional materials may be disposed between the acoustic Bragg reflector 440 and the surface 322 of the substrate 320 and/or between the Bragg reflector 440 and the back surface 314 of the piezoelectric plate 310. Such additional material layers may be present, for example, to facilitate bonding the piezoelectric plate 310, the acoustic Bragg reflector 440, and the substrate 320.

The acoustic Bragg reflector 440 includes multiple layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth of the acoustic wavelength at or near a resonance frequency of the SM XBAR 300. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, silicon carbide, and metals such as molybdenum, tungsten, gold, and platinum. All of the high acoustic impedance layers of the acoustic Bragg reflector 440 are not necessarily the same material, and all of the low acoustic impedance layers are not necessarily the same material. In the example of FIG. 4, the acoustic Bragg reflector 440 has a total of six layers. An acoustic Bragg reflector may have more than, or less than, six layers.

The resonance and anti-resonance frequencies of the primary acoustic mode of an XBAR or an SM-XBAR are determined by multiple factors including the type, crystallographic orientation, and thickness of the piezoelectric slab and the pitch and mark of the IDT fingers. In particular, different combinations of mark and pitch on the same piezoelectric diaphragm can excite the same primary acoustic mode. In this context, two acoustic modes are considered to be the same if the two acoustic modes have the same direction of acoustic energy flow and the same resonance and/or anti-resonance frequencies.

A radio frequency or microwave signal applied across the IDT of an XBAR or an SM-XBAR may also excite undesired spurious acoustics modes. The frequency and strength of such spurious acoustic modes also depend on multiple factors including the pitch and mark of the IDT fingers. However, two or more mark/pitch combinations that excite the same primary acoustic mode do not necessarily excite the same spurious modes. When the pitch and mark within an IDT is changed between two or more mark/pitch combinations that produce the same primary acoustic mode but different spurious modes, the different spurious modes will not add constructively over the area of the IDT.

Figure 5:
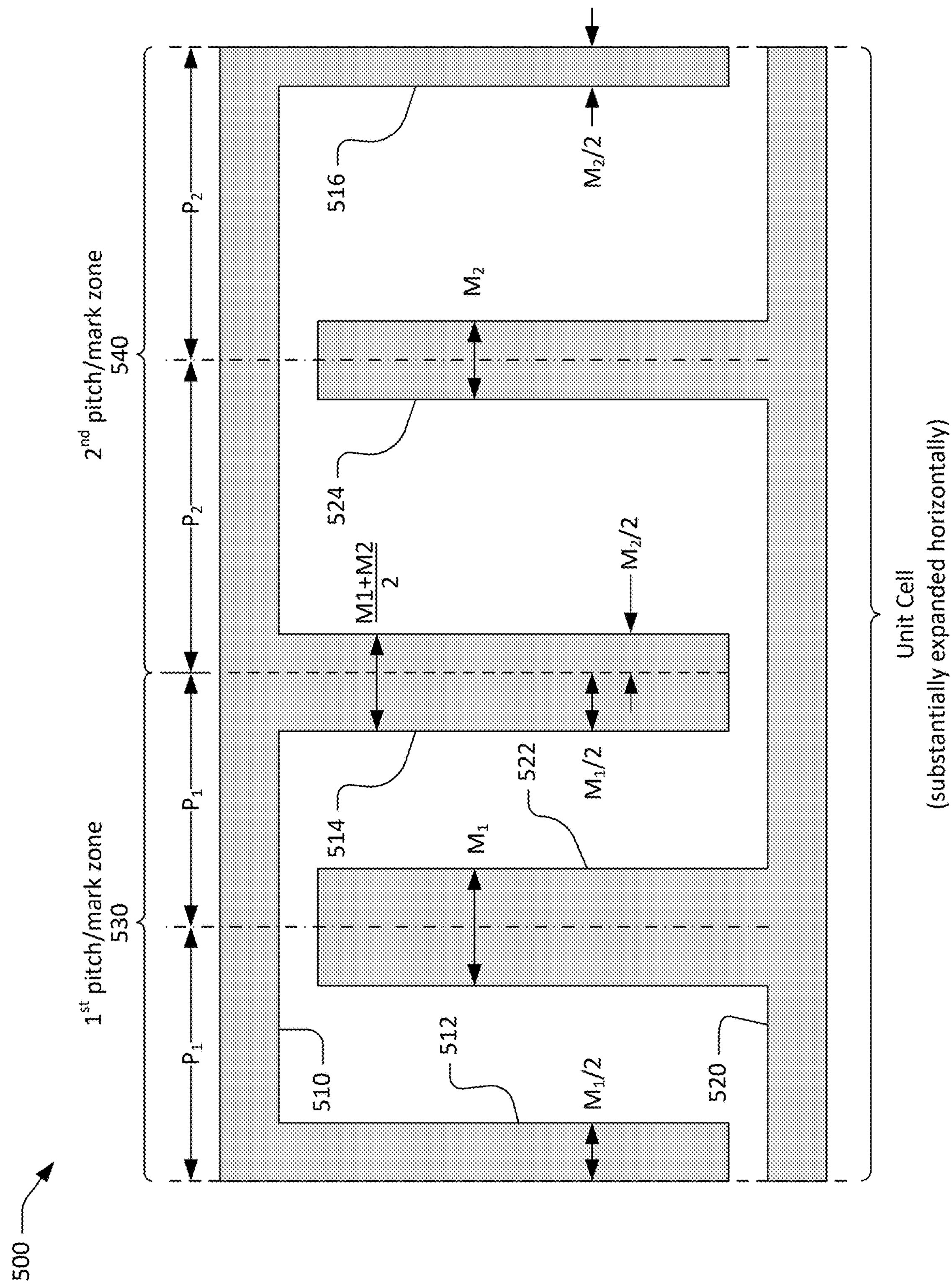
FIG. 5 is an expanded schematic plan view of a unit cell for an interdigital transducer (IDT) with pitch and mark varied along the length of the IDT.

FIG. 5 is an expanded schematic plan view of a unit cell 500 for an IDT where the pitch and mark vary along the length of the IDT. The scale of the plan view has been stretched or expanded horizontally for ease of presentation of the various dimensions. In the unit cell 500, $P_1$ is a first pitch value, $P_2$ is a second pitch value, $M_1$ is a first mark value and $M_2$ is a second mark value. The differences between $P_1$ and $P_2$ and between $M_1$ and $M_2$ are exaggerated for ease of visualization. An IDT having a pitch $P_1$ and a mark $M_1$ would excite a primary acoustic mode with particular resonance and antiresonance frequencies. An IDT having a pitch $P_2$ and a mark $M_2$ would excite the same primary acoustic mode, which is to say a primary acoustic mode with the same resonance and/or antiresonance frequencies.

The unit cell 500 includes a first set of IDT fingers 512, 514, 516 extending from an upper busbar 510, and a second set of IDT fingers 522, 524 extending from a lower busbar 520. In this patent, directional terms such as upper, lower, left, right, vertical, horizontal, etc. refer to direction or position within the drawing being discussed and do not imply any physical position or orientation. The unit cell 500 is intended to be cascaded in the horizontal direction (as will be described in conjunction with FIG. 6) to form an IDT. The unit cell 500 only includes portions of the end fingers 512 and 516. Other portions of those fingers exist within adjacent unit cells (not shown in FIG. 5).

The unit cell 500 is divided into a first pitch/mark zone 530 and a second pitch/mark zone 540. Within the first pitch/mark zone 530, the pitch between adjacent fingers is $P_1$ and the mark of the fingers is $M_1$. Within the second pitch/mark zone 540, the pitch between adjacent fingers is $P_2$ and the mark of the fingers is $M_2$. The mark/pitch combination of the IDT changes between $M_1/P_1$ and $M_2/P_2$ every two fingers. To this end, each finger 512, 514, 516 of first set of IDT fingers extending from the upper busbar 510 has a uniform width of $(M_1+M_2)/2$, including portions of fingers 512 and 516 within adjacent unit cells. Note that the pitch is not measured to the respective centers of the first set of IDT fingers, but to a dashed line that divides each finger in a ratio of $M_1/M_2$. For example, finger 514 is divided such that the portion of the finger extending left into the 1st pitch/mark zone 530 has a width of $M_1/2$, and the portion of this finger extending right into the 2nd pitch/mark zone 540 has a width of $M_2/2$. The second set of IDT fingers 522, 524 extending from the lower busbar 520 has a center-to-center distance between adjacent fingers equal to $P_1+P_2$. The mark of the second set of IDT fingers 522, 524 alternates between $M_1$ (e.g. finger 522) and $M_2$ (e.g. finger 524). The net effect is that the unit cell 500 has two periods of pitch $P_1$ and mark $M_1$ followed by two periods of pitch $P_2$ and mark $M_2$.

Figure 6:
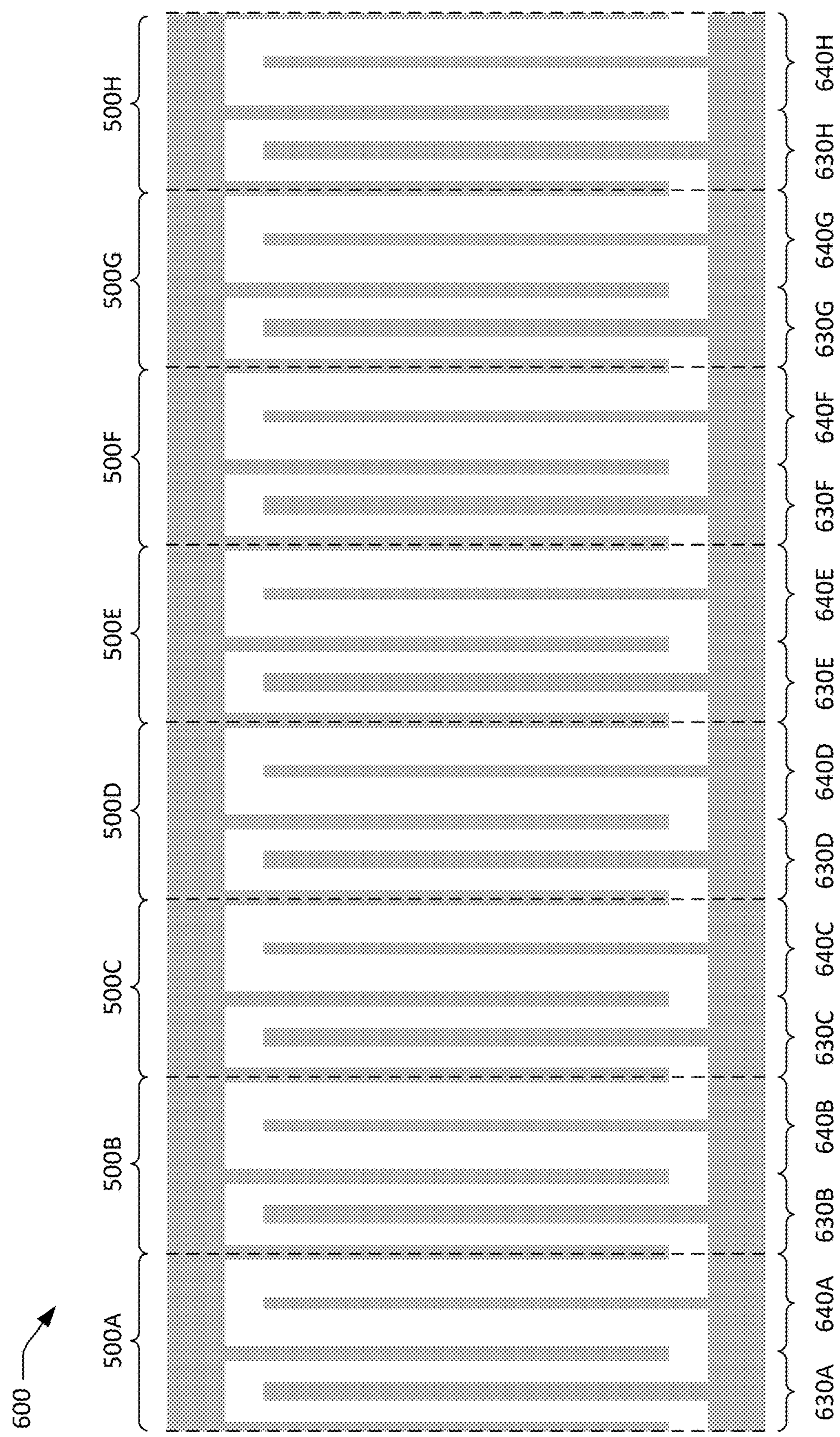
FIG. 6 is a schematic plan view of an IDT made up of eight of the unit cells of FIG. 5.

The unit cell 500 may be cascaded to provide an IDT with any desired length with a corresponding number of fingers. FIG. 6 is a schematic plan view of an IDT 600 composed of eight copies 500A to 500H of the unit cell 500 juxtaposed along the length of the IDT 600 resulting in a total of 33 fingers. The IDT 600 is shown reasonably to scale (approximately 1600:1), with the exception that the differences between $P_1$ and $P_2$ and between $M_1$ and $M_2$ are still exaggerated for ease of visualization. The IDT 600 has eight first pitch/mark zones 630A to 630H in which the pitch and mark are $P_1$ and $M_1$, respectively. The eight first pitch/mark zones 630A to 630H are interleaved with eight second pitch/mark zones 640A to 640H, in which the pitch and mark are $P_2$ and $M_2$, respectively. A pattern of two periods of pitch $P_1$ and mark $M_1$ alternating with two periods of pitch $P_2$ and mark $M_2$ is continued along the length of the IDT. Using eight copies of the unit cell 500 is exemplary and an IDT may use more or fewer than 8 unit cells and have more or fewer than 33 fingers.

Figure 7:
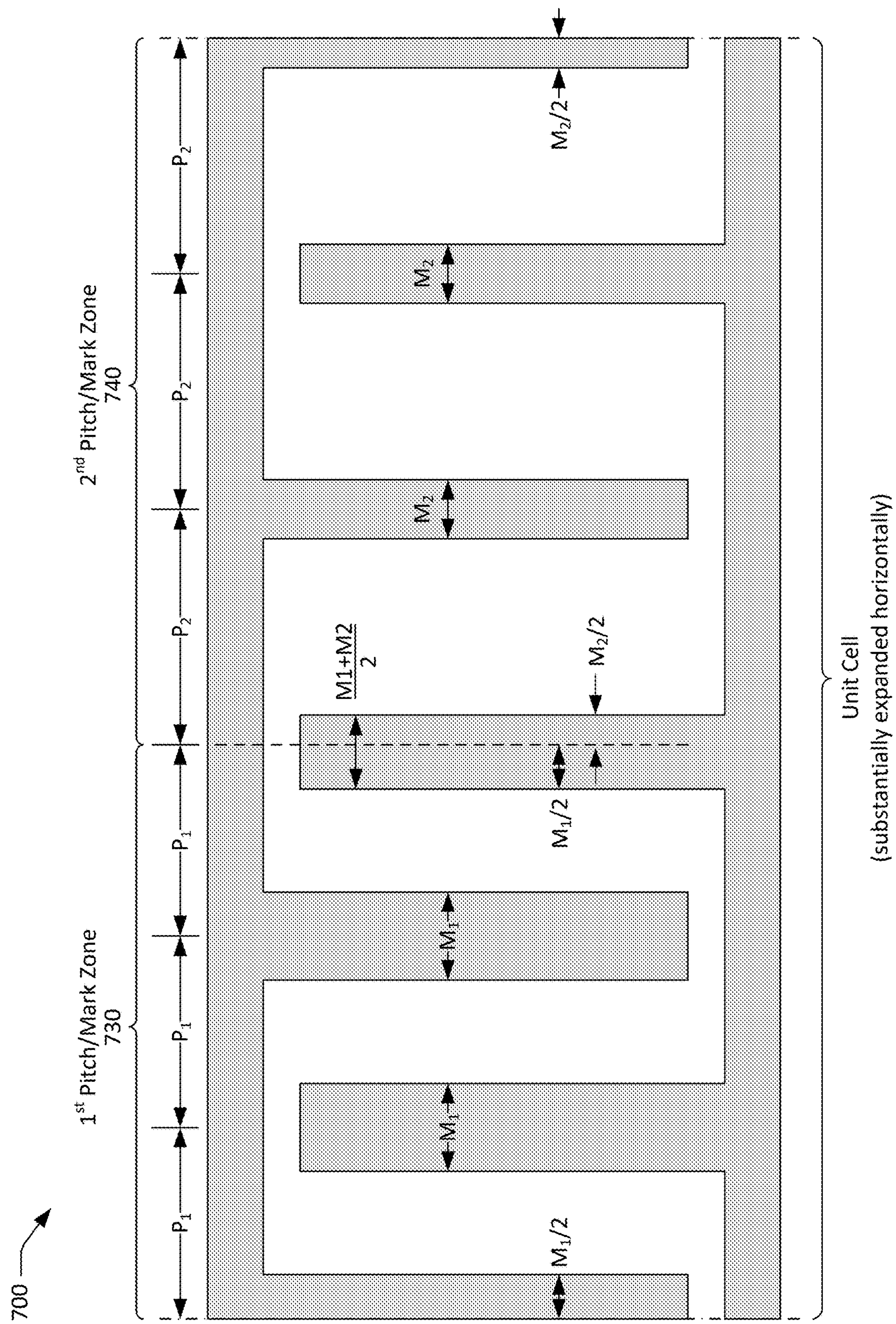
FIG. 7 is an expanded schematic plan view of another unit cell for an interdigital transducer (IDT) with pitch and mark varied along the length of the IDT.

The unit cell 500 is exemplary. A unit cell for varying the pitch and mark along the length of an IDT may, for example, may have three or more consecutive periods of each mark/pitch combination as shown in FIG. 7. FIG. 7 shows a unit cell 700 including a first pitch/mark zone 730 in which the pitch and mark are $P_1$ and $M_1$, respectively, and a second pitch/mark zone 740 in which the pitch and mark are $P_2$ and $M_2$, respectively. Each pitch/mark zone 730, 740 includes three periods of the respective pitch/mark combination.

Figure 8:
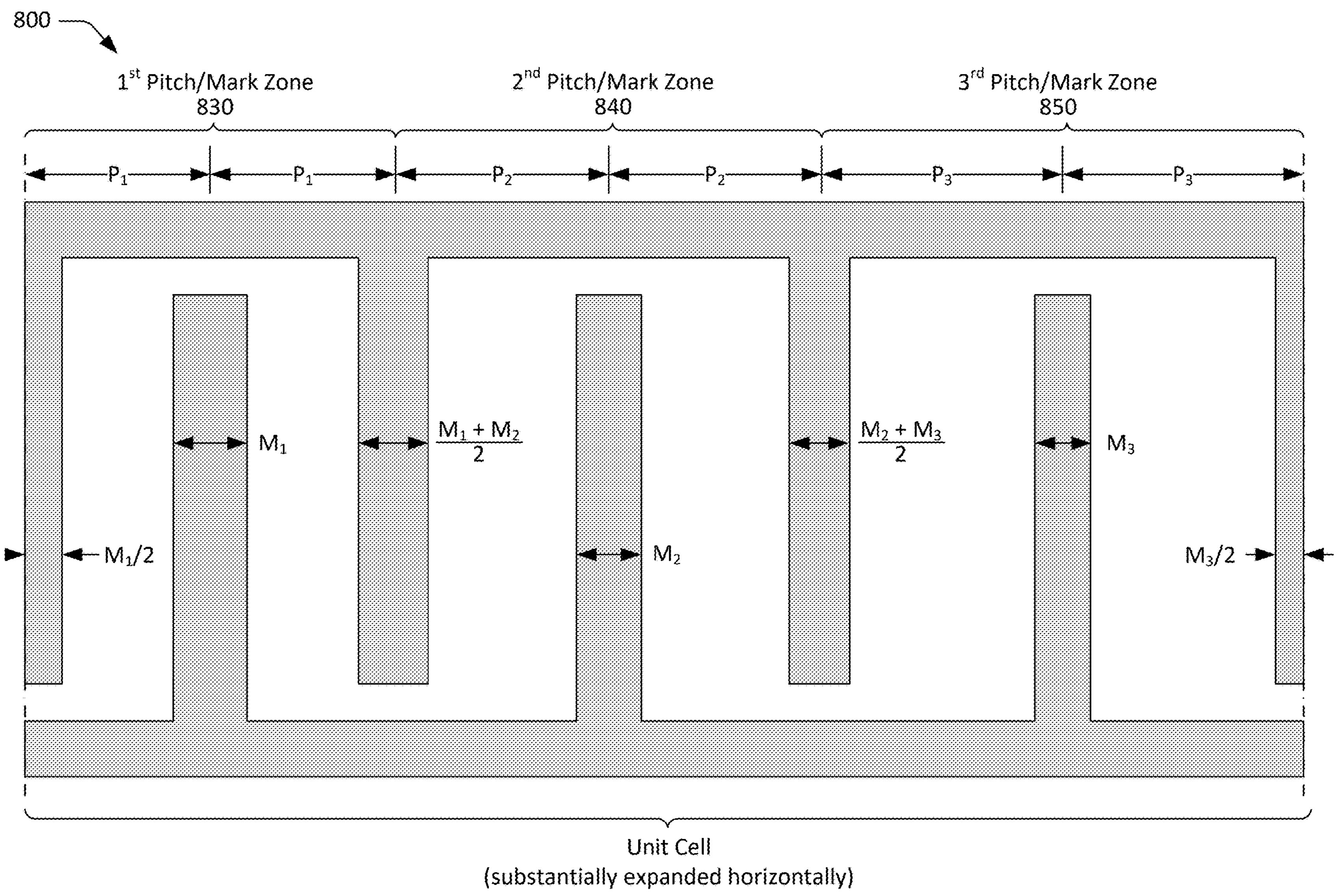
FIG. 8 is an expanded schematic plan view of another unit cell for an interdigital transducer (IDT) with pitch and mark varied along the length of the IDT.

Alternatively, or additionally, a unit cell for varying the pitch and mark along the length of an IDT may cycle between three or more mark/pitch zones as shown in FIG. 8. FIG. 8 shows a unit cell 800 including a first pitch/mark zone 830 in which the pitch and mark are $P_1$ and $M_1$, respectively, a second pitch/mark zone 840 in which the pitch and mark are $P_2$ and $M_2$, respectively, and a third pitch/mark zone 850 in which the pitch and mark are $P_3$ and $M_3$, respectively. The pitch and mark of the three pitch/mark zones are unique, which is to say $P_1 \neq P_2 \neq P_3 \neq P_1$ and $M_1 \neq M_2 \neq M_3 \neq M_1$. Each pitch/mark zone 830, 840, 850 includes two periods of the respective pitch/mark combination. When an IDT is comprised of three or more pitch/mark zones, each pitch/mark zone will have a unique pitch and unique mark that are not equal to the pitch and mark, respectively, of any other pitch/mark zone.

Figure 9:
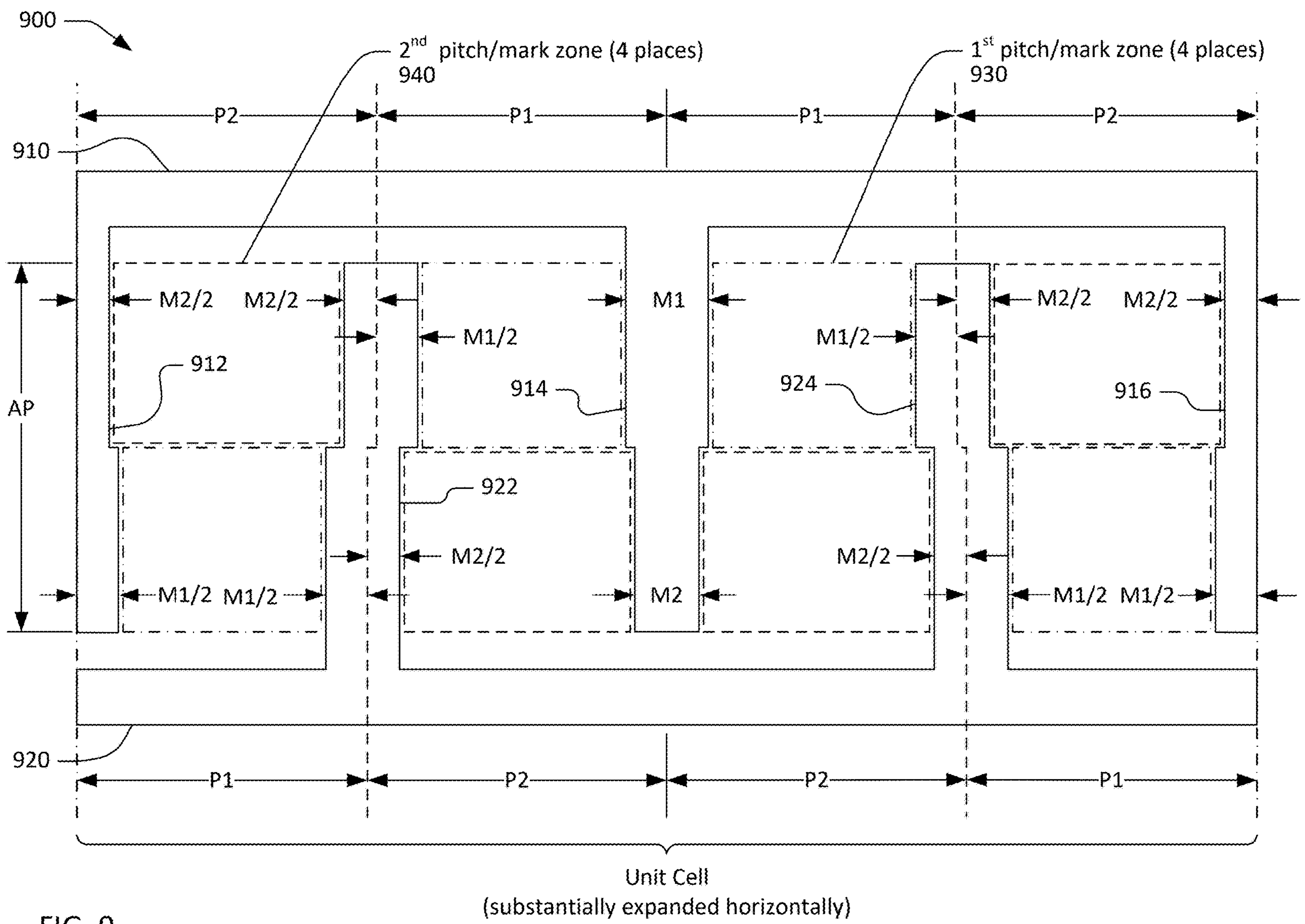
FIG. 9 is an expanded schematic plan view of a unit cell for an IDT with pitch and mark varied across the aperture of the IDT.

FIG. 9 is an expanded schematic plan view of a unit cell 900 for an IDT where pitch and mark vary across the aperture of the IDT. The scale of the plan view has been stretched or expanded horizontally for ease of presentation of the various dimensions. In the unit cell 900, $P_1$ is a first pitch value, $P_2$ is a second pitch value, $M_1$ is a first mark value and $M_2$ is a second mark value. The differences between $P_1$ and $P_2$ and between $M_1$ and $M_2$ are exaggerated for ease of visualization. An IDT having a pitch $P_1$ and a mark $M_1$ would excite a primary acoustic mode with particular resonance and antiresonance frequencies. An IDT having a pitch $P_2$ and a mark $M_2$ would excite the same primary acoustic mode, which is to say a primary acoustic mode with the same resonance and/or antiresonance frequencies.

The unit cell 900 includes a first set of IDT fingers 912, 914, 916 extending from an upper busbar 910, and a second set of IDT fingers 922, 924 extending from a lower busbar 920. The unit cell 900 is intended to be cascaded in the horizontal direction to form an IDT. The unit cell 900 only includes portions of the end fingers 912 and 916. Other portions of those fingers exist within adjacent unit cells (not shown in FIG. 9).

In the unit cell 900, dot-dash rectangles 930 identify first pitch/mark zones of the IDT where the local pitch is $P_1$ and the local mark is $M_1$. Dashed rectangles 940 identify second pitch/mark zones of the IDT where the local pitch is $P_2$ and the local mark is $M_2$. The mark/pitch combination of the IDT steps between $M_1/P_1$ and $M_2/P_2$ across the aperture AP for every pair of fingers. D For example, the pitch between fingers 912 and 922 is $P_2$ and the mark is $M_2$ over the upper half of the aperture proximate the upper busbar 910. The pitch between fingers 912 and 922 is $P_1$ and the mark is $M_1$ over the lower half of the aperture AP proximate the lower busbar 920. The upper half of the aperture between fingers 912 and 922 is a $2^{nd}$ pitch/mark zone 940 (as indicated by the dashed rectangle). The lower half of the aperture between fingers 912 and 922 is a 1st pitch/mark zone 930 (as indicated by the dot-dash rectangle). The change between a first pitch/mark zone and a second pitch/mark zone is reversed between fingers 922 and 914.

The unit cell 900 may be cascaded to provide an IDT with any desired length with a corresponding number of fingers. The unit cell 900 is exemplary. A unit cell for varying the pitch and mark across the aperture of an IDT may, for example, switch between three or more mark/pitch combinations and may switch between pitch/mark combinations in two or more steps across the aperture.

Figure 10:
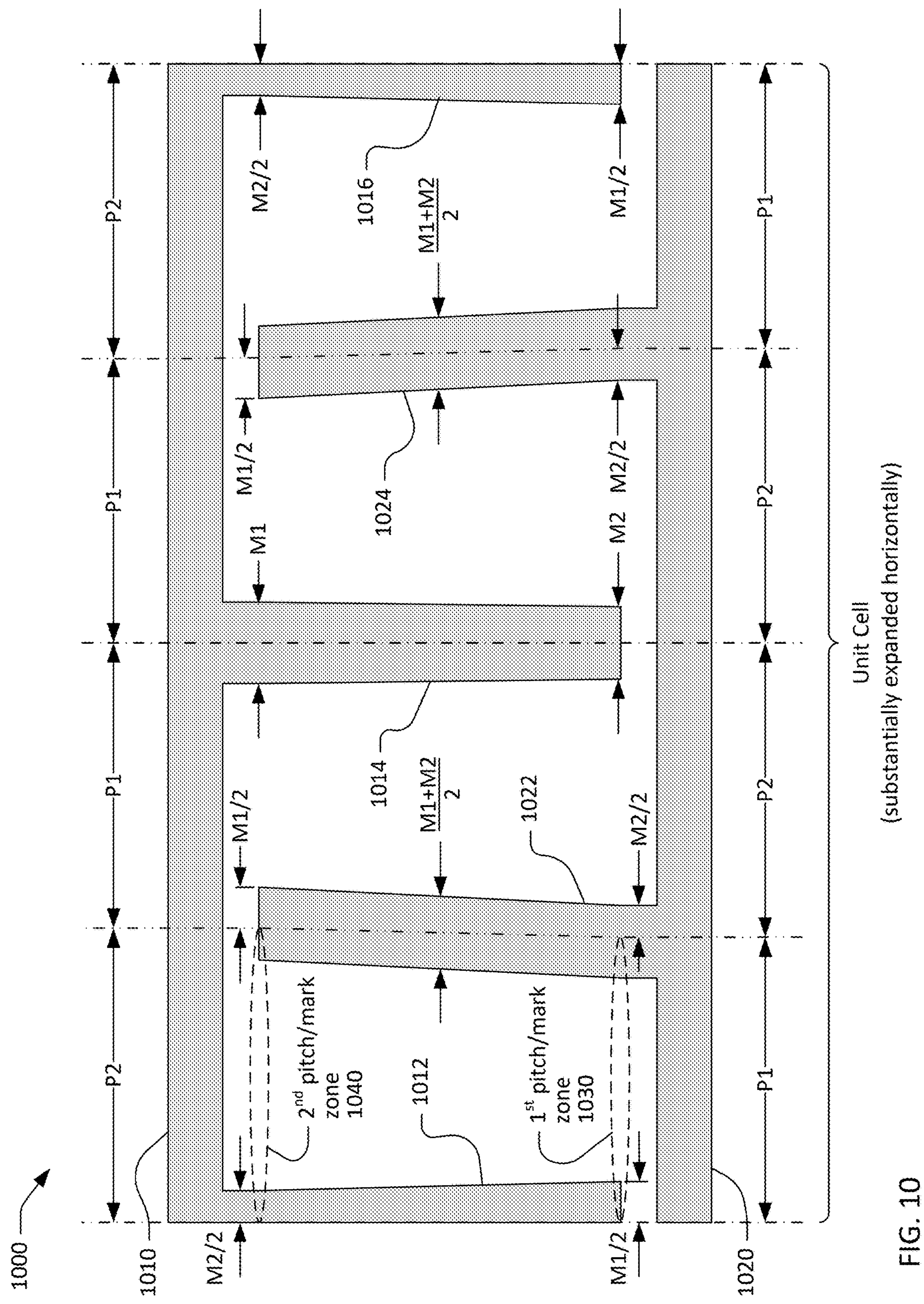
FIG. 10 is an expanded schematic plan view of another unit cell for an IDT with pitch and mark varied continuously across the aperture of the IDT.

FIG. 10 is an expanded schematic plan view of another unit cell 1000 for an IDT with pitch and mark continuously varied across the aperture of the IDT. The scale of the plan view has been stretched or expanded horizontally for ease of presentation of the various dimensions. In the unit cell 1000, $P_1$ is a first pitch value, $P_2$ is a second pitch value, $M_1$ is a first mark value and $M_2$ is a second mark value. The differences between $P_1$ and $P_2$ and between $M_1$ and $M_2$ are exaggerated for ease of visualization. An IDT having a pitch $P_1$ and a mark $M_1$ would excite a primary acoustic mode with particular resonance and antiresonance frequencies. An IDT having a pitch $P_2$ and a mark $M_2$ would excite the same primary acoustic mode, which is to say a primary acoustic mode with the same resonance and/or antiresonance frequencies.

The unit cell 1000 includes a first set of IDT fingers 1012, 1014, 1016 extending from an upper busbar 1010, and a second set of IDT fingers 1022, 1024 extending from a lower busbar 1020. The unit cell 1000 is intended to be cascaded in the horizontal direction (as was described in conjunction with FIG. 6) to form an IDT. The unit cell 1000 only includes portions of the end fingers 1012 and 1016. Other portions of those fingers exist within adjacent unit cells (not shown in FIG. 10).

In the unit cell 1000, the mark/pitch combination of the IDT varies continuously between $M_1/P_1$ and $M_2/P_2$ across the aperture of the IDT for every pair of fingers. For example, fingers 1012 and 1022 form a second pitch/mark zone 1040 with pitch=$P_2$ and mark=$M_2$ at the upper edge of the aperture proximate the upper busbar 1010. The same two fingers 1012, 1011 form a second pitch/mark zone 1040, with pitch=$P_1$ and mark=$M_1$, at the lower edge of the aperture proximate the lower busbar 1020. Conversely, the pitch between fingers 1022 and 1014 is $P_1$ at the upper edge of the aperture AP proximate the upper busbar 1010 and $P_2$ at the lower edge of the aperture AP proximate the lower busbar 1020.

To accomplish this change in pitch, at least portions of fingers 1022 and 1024 within the aperture AP are tilted, which is to say not perpendicular to the lower bus bar 1020. Specifically, the portion of finger 1022 within the aperture AP tilts from perpendicular to the lower busbar 1020 by an angle equal to the arctangent of $(P_2-P_1)/AP$. The portion of finger 1024 within the aperture AP tilts from perpendicular to the lower busbar 1020 by the same angular magnitude in the opposite direction of the tilt of finger 1022. The spacing between adjacent fingers in the same set of fingers (e.g. between fingers 1012 and 1014 or fingers 1022 and 1024) is $P_2+P_1$.

To maintain constant resonance and/or anti-resonance frequencies, the mark must also vary across the aperture. To this end, the first set of IDT fingers 1012, 1014, 1016 extending from the upper busbar 1010 are tapered and the second set of IDT fingers 1022, 1024 extending from the lower busbar 1020 are tilted. For example, the width of fingers 1012 and 1016 (including the portions in the adjacent unit cells) is $M_1$ at the upper edge of the aperture AP proximate the upper busbar 1010 and $M_2$ at the lower edge of the aperture AP proximate the lower busbar 1020. Conversely, the width of finger 1014 is $M_2$ at the upper edge of the aperture AP proximate the upper busbar 1010 and $M_1$ at the lower edge of the aperture AP proximate the lower busbar 1020. The tilted fingers 1022 and 1024 have a fixed width, parallel to the busbars 1010, 1020 equal to $(M_1+M_2)/2$. Simulation results show that an RF signal applied to the unit cell 100 excites essentially the same shear primary acoustic mode over the entire unit cell 1000. Tapering the first set of fingers between $M_1$ and $M_2$ and using the average of $M_1$ and $M_2$ for the second set of fingers has the same effect as a mark equal to $M_1$ where the pitch is $P_1$ and a mark equal to $M_2$ where the pitch is $P_2$. Thus the effective mark is equal to $M_1$ where the pitch is $P_1$ and the effective mark is equal to $M_2$ where the pitch is $P_2$.

Figure 11:
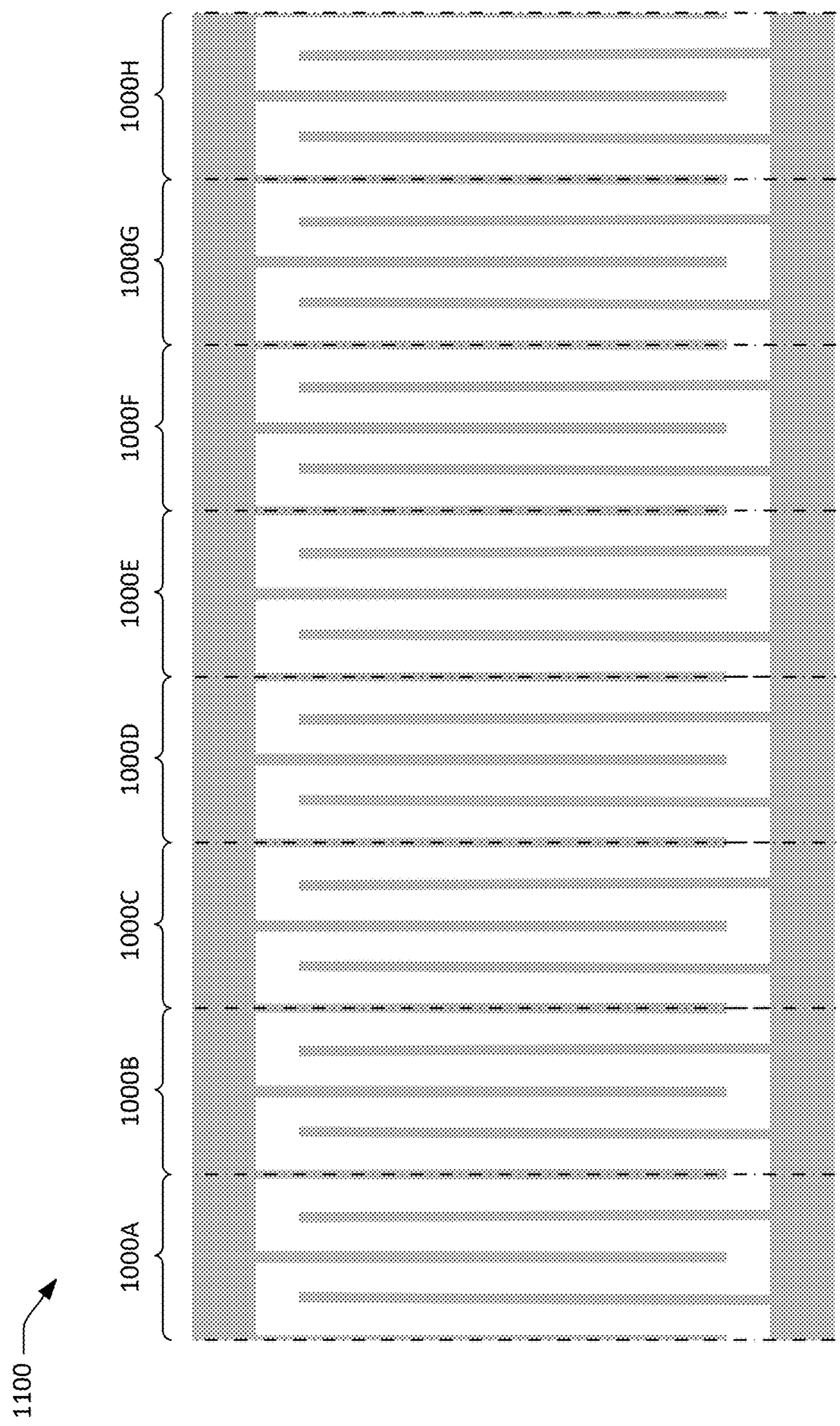
FIG. 11 is a schematic plan view of an IDT made up of eight of the unit cells of FIG. 8.

The unit cell 1000 may be cascaded to provide an IDT with any desired length with a corresponding number of fingers. FIG. 11 is a schematic plan view of an IDT 1100 composed of eight copies 1000A TO 1000H of the unit cell 1000 juxtaposed along the length of an IDT with a total of 33 fingers. The IDT 1100 is shown reasonably to scale. For every pair of adjacent fingers, the effective mark and pitch vary between $M_1/P_1$ and $M_2/P_2$ across the aperture of the IDT.

The IDT 1100 is exemplary. An IDT with varied pitch and mark across the aperture may, for example, have more or fewer that 8 unit cells and more or fewer than 33 fingers. An IDT may use two or more two or more different unit cells in rotation.

Figure 12:
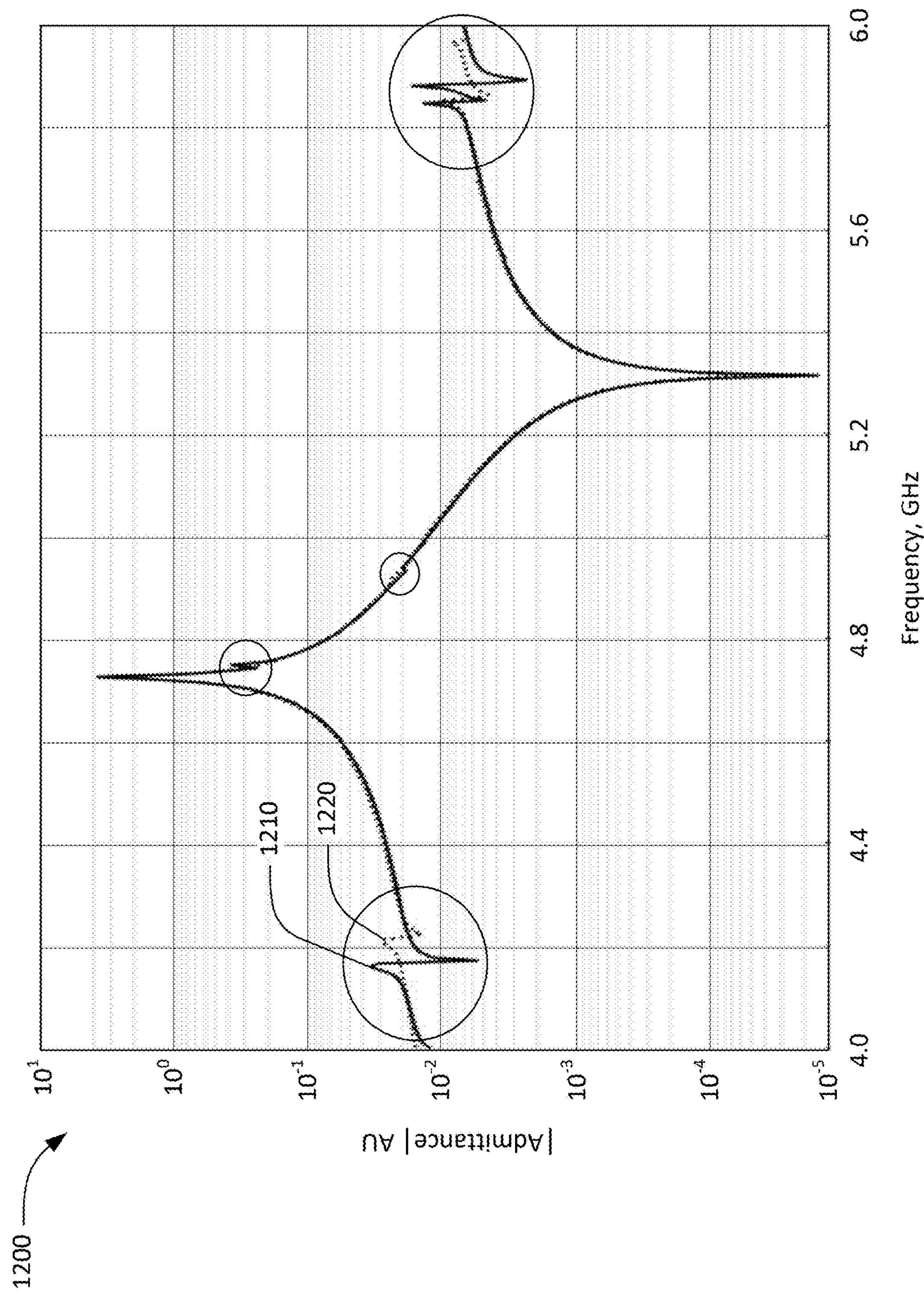
FIG. 12 is a chart comparing the admittances of a simulated XBAR with varied pitch and mark and a simulated XBAR with constant pitch and mark.

FIG. 12 is a chart illustrating the effect that varying IDT pitch and mark can have on XBAR performance. The solid curve 1210 is a plot of the magnitude of the admittance as a function of frequency for a representative conventional XBAR device with fixed IDT pitch and mark. The dashed curve 1210 exhibits a primary acoustic mode with a resonance at about 4.72 GHz and an antiresonance at about 5.31 GHz. The curve 1220 also exhibits spurious acoustic modes (which are circled in FIG. 12) at about 4.15 GHz, 4.75 GHz, 4.95 GHz, and 5.85 GHz to 5.9 GHz. The dashed curve 1220 is a plot of the magnitude of the admittance as a function of frequency for a comparable XBAR device with the IDT pitch and mark varied across the aperture as shown in FIG. 10 and FIG. 11. The curve 1220 exhibits a primary acoustic mode that is essentially the same as the primary acoustic mode of the conventional XBAR device (solid curve 1210). The various spurious acoustic modes are substantially suppressed by varying the IDT pitch and mark.

The curves 1210 and 1220 in FIG. 12 are result of simulation of XBAR devices using a finite element method. The representative XBAR device (solid curve 1210) had a lithium niobate diaphragm 400 nm thick and aluminum electrodes 100 nm thick. The pitch and mark of the IDT were 3.875 μm and 850 nm, respectively. The XBAR device with varying mark and pitch (dashed curve 1220) also has a lithium niobate diaphragm 400 nm thick and aluminum electrodes 100 nm thick. The pitch and mark values were $P_1$=3.875 μm, $P_2$=3.75 μm, $M_1$=850 nm, and $M_2$=975 nm.

The XBAR devices simulated to generate the curves 1210 and 1220 are exemplary. XBAR devices may be designed with different dimensions for operation at the same or other frequencies.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:

a substrate having a surface;

a single-crystal piezoelectric plate having front and back surfaces, the back surface attached to the surface of the substrate; and an interdigital transducer (IDT) including interleaved fingers formed on the front surface of the single-crystal piezoelectric plate, the IDT comprising:

a first pitch/mark zone having a pitch between adjacent interleaved fingers equal to a first pitch value $P_1$ and a mark of the interleaved fingers equal to a first mark value $M_1$, and a second pitch/mark zone having a pitch between adjacent interleaved fingers equal to a second pitch value $P_2$ not equal to $P_1$ and a mark of the interleaved fingers equal to a second mark value $M_2$ not equal to $M_1$, wherein the IDT further comprises a first set of first fingers extending from a first busbar interleaved with a second set of fingers extending from a second busbar, a mark of each first finger tapers between $M_1$ and $M_2$ across the aperture of the IDT, a mark of each second finger is $(M_1+M_2)/2$, and a portion of each second finger within the aperture is not perpendicular to the second bus bar and an angle between the portion of each second finger within the aperture and the second busbar is 90°+arctangent $((P_2-P_1)/AP)$, where AP is a distance across the aperture of the IDT, and wherein a radio frequency signal applied to the IDT causes excitation of a same shear primary acoustic mode by both the first pitch/mark zone and the second pitch/mark zone.

2. The acoustic resonator device of claim 1, wherein a portion of the single-crystal piezoelectric plate forms a diaphragm spanning a cavity in the substrate, and the interleaved fingers of the IDT are disposed on the diaphragm.

3. The acoustic resonator device of claim 1, further comprising:

an acoustic Bragg reflector sandwiched between the surface of the substrate and the back surface of the single-crystal piezoelectric plate.

4. The acoustic resonator device of claim 1, wherein the radio frequency signal applied to the IDT causes excitation of different spurious acoustic modes by the first pitch/mark zone and the second pitch/mark zone.

5. The acoustic resonator device of claim 1, wherein the IDT comprises two or more unit cells juxtaposed along the length of the IDT, each unit cell comprising at least one first pitch/mark zone and at least one second pitch/mark zone.

6. An acoustic resonator device comprising:

a substrate having a surface;

a single-crystal piezoelectric plate having front and back surfaces, the back surface attached to the surface of the substrate; and an interdigital transducer (IDT) including interleaved fingers formed on the front surface of the single-crystal piezoelectric plate, wherein the IDT changes between a first pitch/mark combination and a second pitch/mark across an aperture of the IDT, wherein the IDT further comprises a first set of first fingers extending from a first busbar interleaved with a second set of fingers extending from a second busbar, a mark of each first finger tapers between a first mark value $M_1$ and a second mark value $M_2$ not equal to $M_1$ across the aperture of the IDT, a mark of each second finger is $(M_1+M_2)/2$, and a portion of each second finger within the aperture is not perpendicular to the second bus bar and an angle between the portion of each second finger within the aperture and the second busbar is 90°+arctangent $((P_2-P_1)/AP)$, where $P_1$ is a first pitch value, $P_2$ is a second pitch value not equal to $P_1$, and AP is a distance across the aperture of the IDT, and wherein a radio frequency signal applied to the IDT causes excitation of a same shear primary acoustic mode by both the first pitch/mark combination and the second pitch/mark combination.

7. The acoustic resonator device of claim 6, wherein a portion of the single-crystal piezoelectric plate forms a diaphragm spanning a cavity in the substrate, and the interleaved fingers of the IDT are disposed on the diaphragm.

8. The acoustic resonator device of claim 6, further comprising:

an acoustic Bragg reflector sandwiched between the surface of the substrate and the back surface of the single-crystal piezoelectric plate.

9. The acoustic resonator device of claim 6, wherein the radio frequency signal applied to the IDT causes excitation of different spurious acoustic modes by the first pitch/mark zone and the second pitch/mark zone.

10. The acoustic resonator device of claim 6, wherein the IDT comprises two or more unit cells juxtaposed along the length of the IDT, each unit cell comprising at least one first pitch/mark zone and at least one second pitch/mark zone.

* * * * *